(12) United States Patent
Oshima

(10) Patent No.: US 7,657,697 B2
(45) Date of Patent: Feb. 2, 2010

(54) METHOD OF CONTROLLING A SEMICONDUCTOR MEMORY DEVICE APPLIED TO A MEMORY CARD

(75) Inventor: Takashi Oshima, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 11/085,530

(22) Filed: Mar. 22, 2005

(65) Prior Publication Data

US 2006/0155918 A1 Jul. 13, 2006

(30) Foreign Application Priority Data

Jan. 11, 2005 (JP) ............................. 2005-004240

(51) Int. Cl.
*G06F 12/00* (2006.01)
(52) U.S. Cl. .................. 711/103; 711/115; 711/154
(58) Field of Classification Search ................. 711/103, 711/162, 115, 154
See application file for complete search history.

(56) References Cited

U.S. PATENT DOCUMENTS

| | | | | |
|---|---|---|---|---|
| 5,912,849 A | * | 6/1999 | Yasu et al. ................... | 365/195 |
| 6,034,897 A | * | 3/2000 | Estakhri et al. ........ | 365/185.33 |
| 7,107,480 B1 | * | 9/2006 | Moshayedi et al. ............ | 714/2 |
| 7,171,536 B2 | * | 1/2007 | Chang et al. ................ | 711/170 |
| 7,191,308 B2 | * | 3/2007 | Hara et al. .................. | 711/213 |
| 2003/0107346 A1 | * | 6/2003 | Bean et al. .................. | 320/136 |
| 2004/0065744 A1 | * | 4/2004 | Shiraishi et al. ............. | 235/492 |
| 2004/0084971 A1 | * | 5/2004 | Shukla et al. ............... | 307/126 |
| 2004/0103238 A1 | * | 5/2004 | Avraham et al. ............. | 711/102 |
| 2004/0151031 A1 | * | 8/2004 | Tanaka ................... | 365/185.29 |
| 2005/0182892 A1 | * | 8/2005 | Nakanishi et al. ........... | 711/103 |
| 2005/0204115 A1 | * | 9/2005 | Matsuno et al. ............. | 711/203 |

FOREIGN PATENT DOCUMENTS

| | | |
|---|---|---|
| JP | 11-306091 | 11/1999 |
| JP | 11-306800 | 11/1999 |
| JP | 2004220068 A * | 8/2004 |

OTHER PUBLICATIONS

English Translation of JP2004220068A, p. 1-9, Aug. 5, 2004.*

\* cited by examiner

*Primary Examiner*—Hong Kim
(74) *Attorney, Agent, or Firm*—Oblon, Spivak, McClelland, Maier & Neustadt, L.L.P.

(57) ABSTRACT

Plural second logic blocks are set to a first logic block, and when data is written to the second logic block, write waiting is given using an address next to the address of the current second logic block. In order to protect data of the written second logic block, the next address is skipped using another address as an expected value.

14 Claims, 10 Drawing Sheets

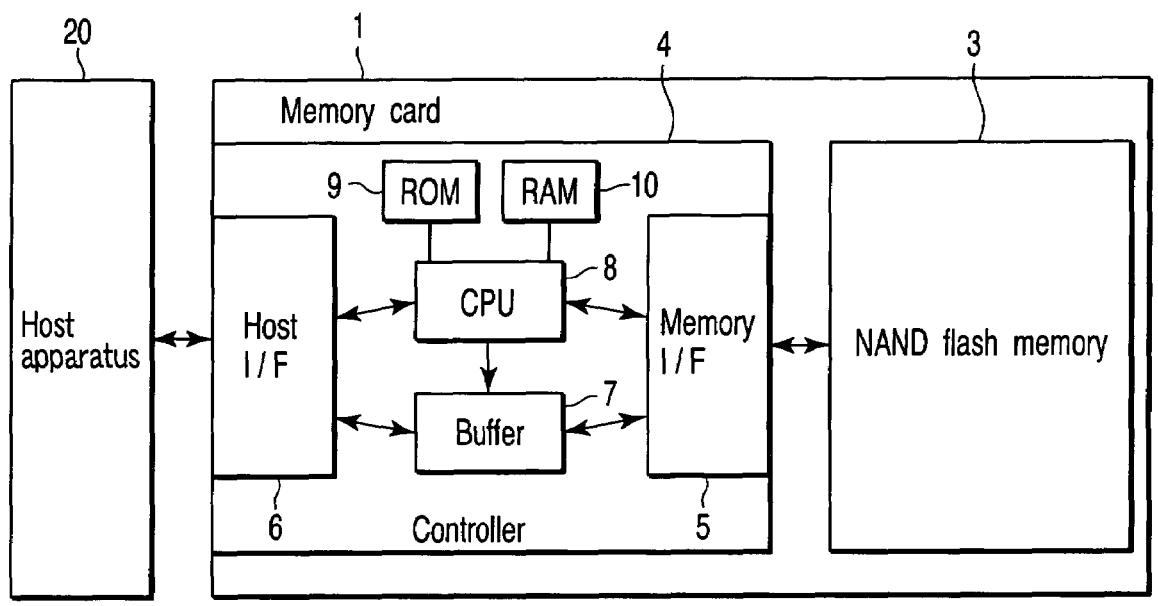
F I G. 2

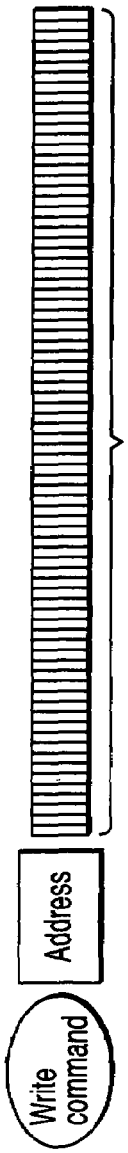
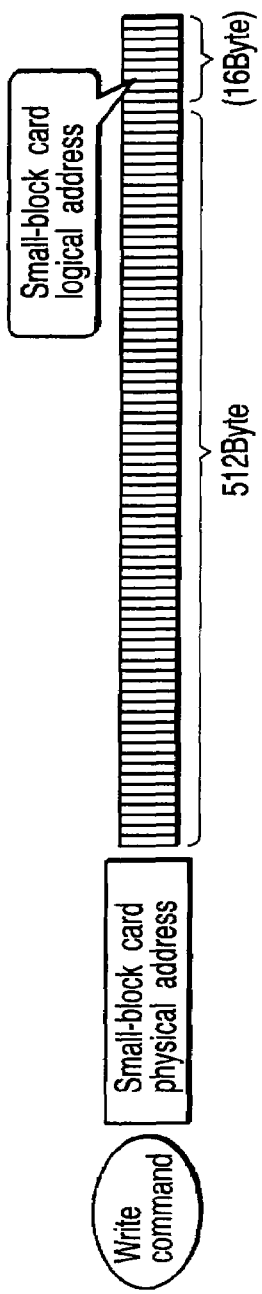
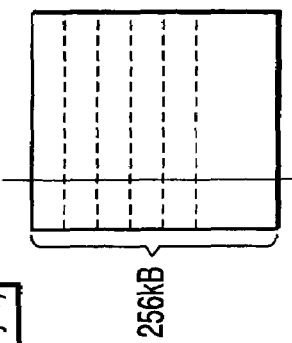
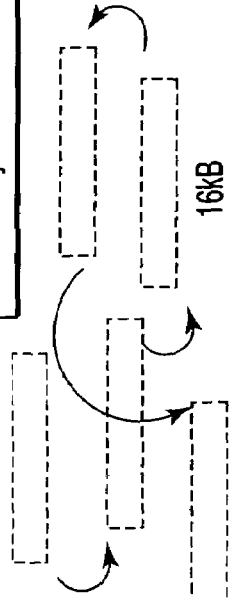
FIG. 5A
FIG. 5B
FIG. 6

Block format

| | ECC0 | | ECC1 | | ECC2 | | ECC3 |
|---|---|---|---|---|---|---|---|
| | 512-byte data of host block page0 | | 512-byte data of host block page1 | | 512-byte data of host block page2 | | 512-byte data of host block page3 | Management data |

Host management block 0 (16 k-byte)
- page 0: 512Byte (0~511) | 10Byte (512~521) | 512Byte (522~1033) | 10Byte (1034~1043) | 512Byte (1044~1555) | 10Byte (1556~1565) | 512Byte (1566~2077) | 24Byte (2078~2101) | 10Byte (2102~2111)
- ...
- page 7: 512Byte | 10Byte | 512Byte | 10Byte | 512Byte | 10Byte | 512Byte | 24Byte | 10Byte Host management block 1 (16 k-byte)
- page 8: 512Byte | 10Byte | 512Byte | 10Byte | 512Byte | 10Byte | 512Byte | 24Byte | 10Byte
- ...
- page 15: 512Byte | 10Byte | 512Byte | 10Byte | 512Byte | 10Byte | 512Byte | 24Byte | 10Byte

......

Host management block 15 (16 k-byte)
- page 120: 512Byte | 10Byte | 512Byte | 10Byte | 512Byte | 10Byte | 512Byte | 24Byte | 10Byte
- ...
- page 127: 512Byte | 10Byte | 512Byte | 10Byte | 512Byte | 10Byte | 512Byte | 24Byte | 10Byte One physical block (256 byte)

FIG. 7

METHOD OF CONTROLLING A SEMICONDUCTOR MEMORY DEVICE APPLIED TO A MEMORY CARD

CROSS-REFERENCE TO RELATED APPLICATIONS

This application is based upon and claims the benefit of priority from prior Japanese Patent Application No. 2005-004240, filed Jan. 11, 2005, the entire contents of which are incorporated herein by reference.

BACKGROUND OF THE INVENTION

1. Field of the Invention

The present invention relates to a memory card having a built-in non-volatile semiconductor memory device, and in particular, to a method of controlling the semiconductor memory device.

2. Description of the Related Art

A non-volatile semiconductor memory device such as a NAND flash memory using EEPROM is used as a host apparatus for a digital camera and mobile phone. For example, data stored in the memory card is destroyed resulting from causes such as unexpected removal of the memory card, droppage of the host apparatus and power turn-off.

The following technique has been developed (e.g., see JPN. PAT. APPLN. KOKAI Publication No. 11-306091). According to the technique, a sector having data destroyed by power turn-off is repaired to prevent an actual storage capacity of a memory space of the card from being reduced by the data destroy.

In addition, the following technique has been developed (e.g., see JPN. PAT. APPLN. KOKAI Publication No. 11-306800). According to the technique, a cyclic code is generated from data stored in data storage, and the generated cyclic code is compared with a cyclic code stored in the corresponding block to make a normality test of the block. By doing so, data written in a flash memory is prevented from being destroyed in error.

Recently, a multi-valued NAND flash memory capable of storing several data in one memory cell has been developed. In the multi-valued NAND flash memory, the same column of several pages commonly uses one memory cell. For example, in a four-value NAND flash memory, the same column of two pages commonly uses one memory cell.

The foregoing multi-valued NAND flash memory has the following problems. More specifically, when write is made to one of pages commonly using the memory cell, a write error occurs. Moreover, if write is interrupted resulting for some reason, there is a possibility that the content of another previously written page is destroyed.

For example, a memory card having the NAND flash memory is applied to a digital camera. In this case, when a photograph is taken using the digital camera, photograph data is normally written in the flash memory. Thereafter, when a photograph is taken again, write to the flash memory fails resulting from reasons such as unexpected removal of the memory card, droppage of the camera body and power turn-off during data write. In such a case, the write data is not normally recorded. In addition, there is a possibility that the photograph data of an already written page is destroyed resulting from page management performance of the multi-valued NAND flash memory. Therefore, it is desired to provide a method of controlling a semiconductor memory device, which is capable of preventing a destroy of already written data when writing new data.

BRIEF SUMMARY OF THE INVENTION

According to a first aspect of the invention, there is provided a method of controlling a semiconductor memory device having plural blocks, and capable of erasing data using the block as an erase unit, comprising: skipping an address commonly using the same memory cell as an address storing written data, and using another address as an expected value in order to protect written data; determining whether or not a write address is an address corresponding to the expected value in data write; and storing write data in another block different from the block storing the written data when the write address is different from the address used as the expected value.

According to a second aspect of the invention, there is provided a method of controlling a semiconductor memory device, comprising: writing data of a first logic block address in a first storage area just before power is turned off; detecting the first logic block address when the power is turned on; and skipping a second logic block address next to the detected first logic block address, and giving a write waiting state using a third logic block address as an expected value.

According to a third aspect of the invention, there is provided a method of controlling a semiconductor memory device, comprising: detecting data write of FAT (File Allocation Table); skipping a second logic block address next to a first logic block address of a logic block written to a first storage area before the FAT data is written when the FAT data write is detected; and giving a write waiting state using a third logic block address as an expected value.

BRIEF DESCRIPTION OF THE SEVERAL VIEWS OF THE DRAWING

FIG. 2 is a block diagram showing a host apparatus and the configuration of a memory card;

FIG. 5A and FIG. 5B are views showing a format of command sent from the host apparatus;

FIG. 6 is a view to compare the block wrote operation assumed by the host apparatus with the write operation actually made by the memory card (large-block card);

FIG. 7 is a view showing a block format (256 k-byte physical block used as an erase unit) of a flash memory included in the large-block card;

DETAILED DESCRIPTION OF THE INVENTION

Figure 1:
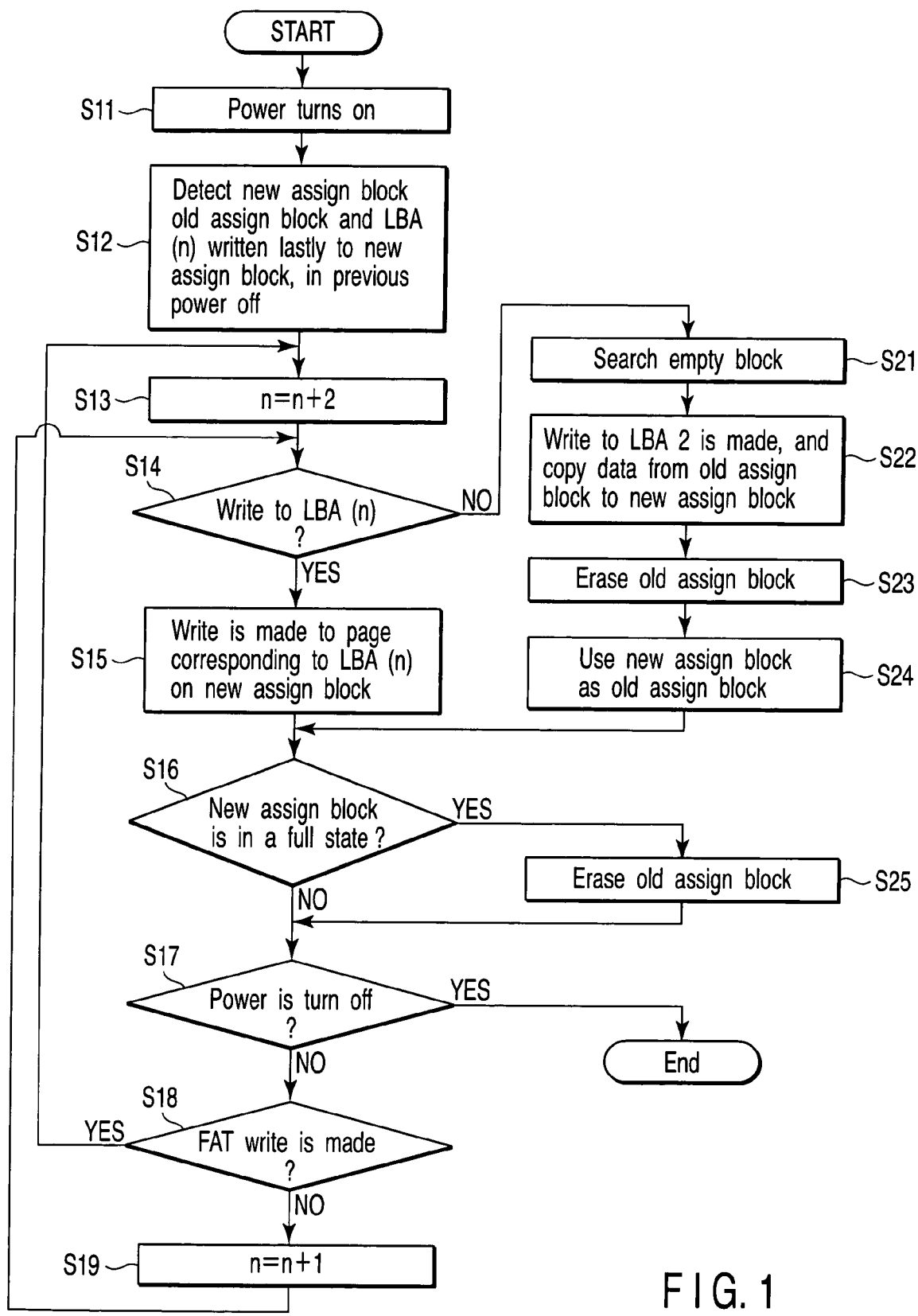
FIG. 1 is a flowchart to explain the operation of the present embodiment.

An embodiment of the present invention will be described below with reference to the accompanying drawings.

A semiconductor memory device to which the present invention is applied will be described below with reference to FIG. 2 to FIG. 10.

FIG. 2 shows a host apparatus and the configuration of a memory card. A memory card 1 has a NAND flash memory 3 and a controller 4. The controller 4 includes functional blocks such as CPU (Central Processing Unit) 8 and ROM (Read-Only Memory) 9. The NAND flash memory 3 is a multi-valued memory, which stores several bits, for example, two bits in one memory cell.

The host apparatus 20 includes hardware and software (system) for making an access to the connected memory card. The host apparatus 20 is built up in a manner of managing the internal physical state of the memory card and directly controlling the flash memory included in the memory card. The physical state means that n logic sector address data is stored in which physical block address, or which block is in an eased state.

On the premise that a NAND flash memory having a 16 k-byte erase block size set in erase is used, the host apparatus 20 assigns logic/physical addresses in units of 16 k-bytes. In many cases, the host apparatus 20 sequentially makes write access or read access with respect to 16 k-byte logic addresses (issues the corresponding command).

When connected to the memory card 20, the memory card 1 is operated after receiving power supply from the host apparatus 20, and follows the procedure in accordance with an access from the host apparatus 20.

The NAND flash memory 3 is a non-volatile memory, which has a 256 k-byte erase block size (block size of erase unit) set in erase. For example, data write/read is made in 16 k-byte units. The NAND flash memory 3 is manufactured using a 0.09 μm process technique. In other words, the NAND flash memory 3 has the design rule of 0.1 μm or less.

The controller 4 has built-in memory interface (I/F) 5, host interface (I/F) 6, buffer 7 and RAM (Random Access Memory) 10, in addition to the foregoing CPU 8 and ROM 9.

The memory interface 5 makes interface processing between the controller 4 and the NAND flash memory 3. On the other hand, the host interface 6 makes interface processing between the controller 4 and the host apparatus 20.

The buffer 7 temporarily stores a predetermined amount of data (e.g., equivalent to one page) when data sent from the host apparatus 20 is written to the NAND flash memory 3. Moreover, the buffer 7 temporarily stores a predetermined amount of data when data read from the NAND flash memory 3 is sent to the host apparatus 20.

The CPU 8 controls the entire operation of the memory card 1. For example, when the memory card 1 receives power supply, the CPU 8 loads firmware (control program) stored in the ROM 9 onto the RAM 10 to execute a predetermined processing. Thus, the CPU 8 prepares various tables on the RAM 10, receives write, read and erase commands from the host apparatus 20 to make access to the corresponding area of the NAND flash memory 3, and controls data transfer via the buffer 7.

The ROM 9 is a memory storing control programs used by the CPU 8. The RAM 10 is a volatile memory, which is used as a work area of the CPU 8, and stored with control programs and various tables.

Figure 3:
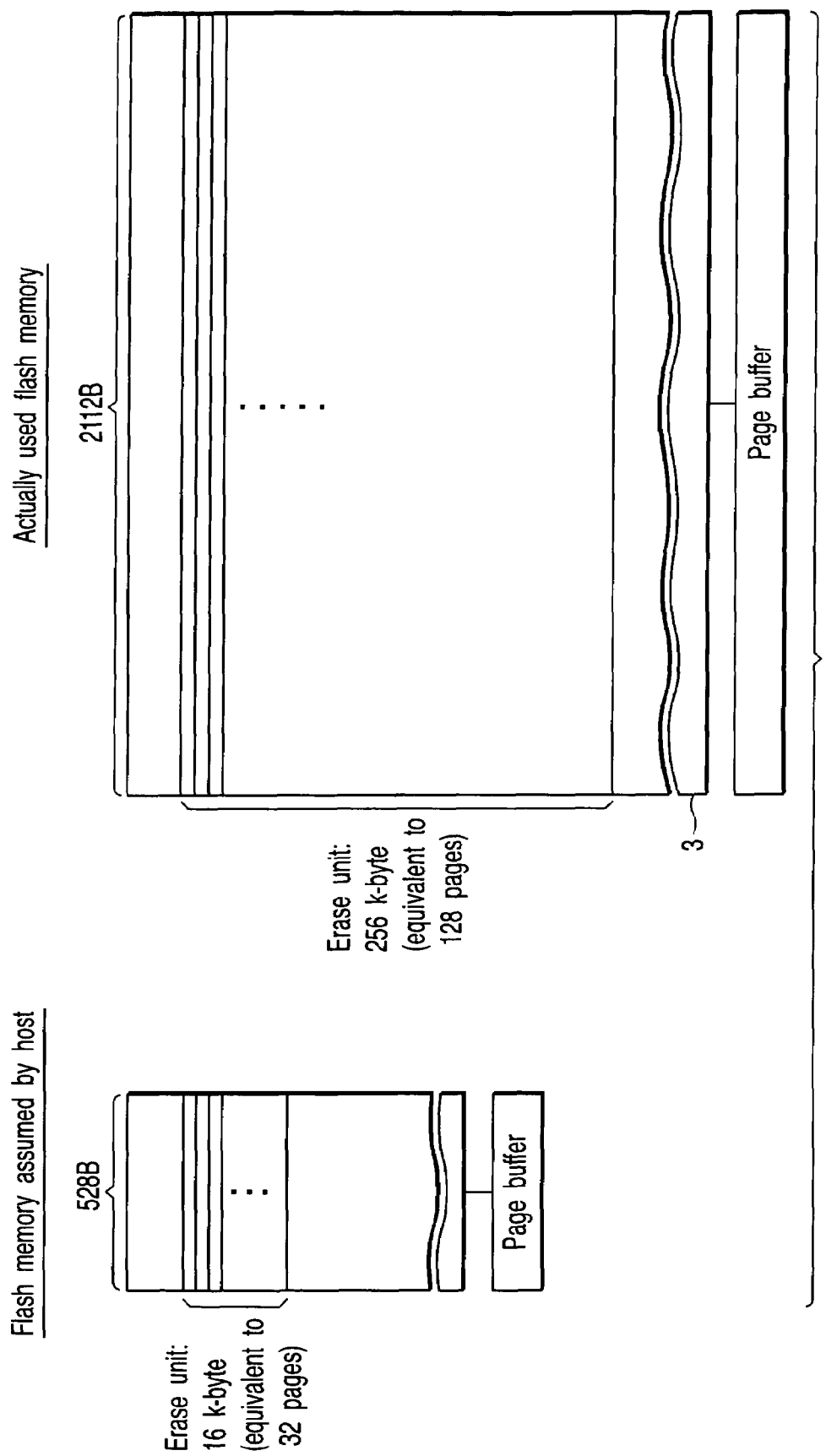
FIG. 3 is a view to explain the difference in data arrangement between a flash memory assumed by the host apparatus and an actually used flash memory.

FIG. 3 is a view to explain the difference in data arrangement between a flash memory assumed by the host apparatus 20 and an actually used flash memory (i.e., NAND flash memory built in the memory card 1).

In the flash memory assumed by the host apparatus 20, each page has 528 bytes (512-byte data storage+16-byte redundancy), and 32 pages are set as one erase unit (i.e., 16 k-byte+0.5 k-byte (k is 1024 bytes)). In the following description, a card including the flash memory described above is referred to as a "small-block card).

On the other hand, in the actually used flash memory card 3, each page has 2112 bytes (e.g., 512-byte data storage×4+10-byte redundancy×4+24-byte management data), and 128 pages are set as one erase unit (i.e., 256 k-byte+8 k-byte). In the following description, a card including the flash memory 3 described above is referred to as a "large-block card). For convenience in the following description, the erase unit of the small-block card is set up with 16 k-byte while the erase unit of the large-block is set up with 256 k-byte.

The flash memory assumed by the host apparatus 20 and the actually used flash memory card 3 include a page buffer for inputting/outputting data to their flash memory. The page buffer included in the flash memory assumed by the host apparatus 20 has a storage capacity of 528 bytes (512 bytes+16 bytes). On the other hand, the page buffer included in the actually used flash memory card 3 has a storage capacity of 2112 bytes (2048 bytes+64 bytes). In data write, these page buffers input and output data to the flash memory in one page units equivalent to their storage capacity.

FIG. 3 shows the case where the erase block size of the actually used flash memory card 3 is 16 times as much as that of the flash memory assumed by the host apparatus 20. However, the present invention is not limited to the case described above; in this case, any other multiples may be used so long as the multiple is an integer.

In order to obtain a large-block card as a practically effective product, it is desirable that the flash memory 3 has a storage capacity of 1-Giga bits or more. For example, if the storage capacity of the flash memory 3 is 1-G bits, the number of 256 k-byte blocks (erase unit) is 512.

Moreover, FIG. 3 shows the case where the erase unit of the flash memory card 3 is 256 k-byte blocks. It is practically effective to construct an erase unit to have 128 k-byte blocks. In this case, the number of 128 k-byte blocks is 1024.

Moreover, FIG. 3 shows the case where the erase block size of the actually used flash memory card 3 is larger than that of the flash memory assumed by the host apparatus 20. However, the present invention is not limited to the case described case. In this case, the erase block size of the actually used flash memory card 3 may be configured smaller than that of the flash memory premised by the host apparatus 20.

Figure 4:
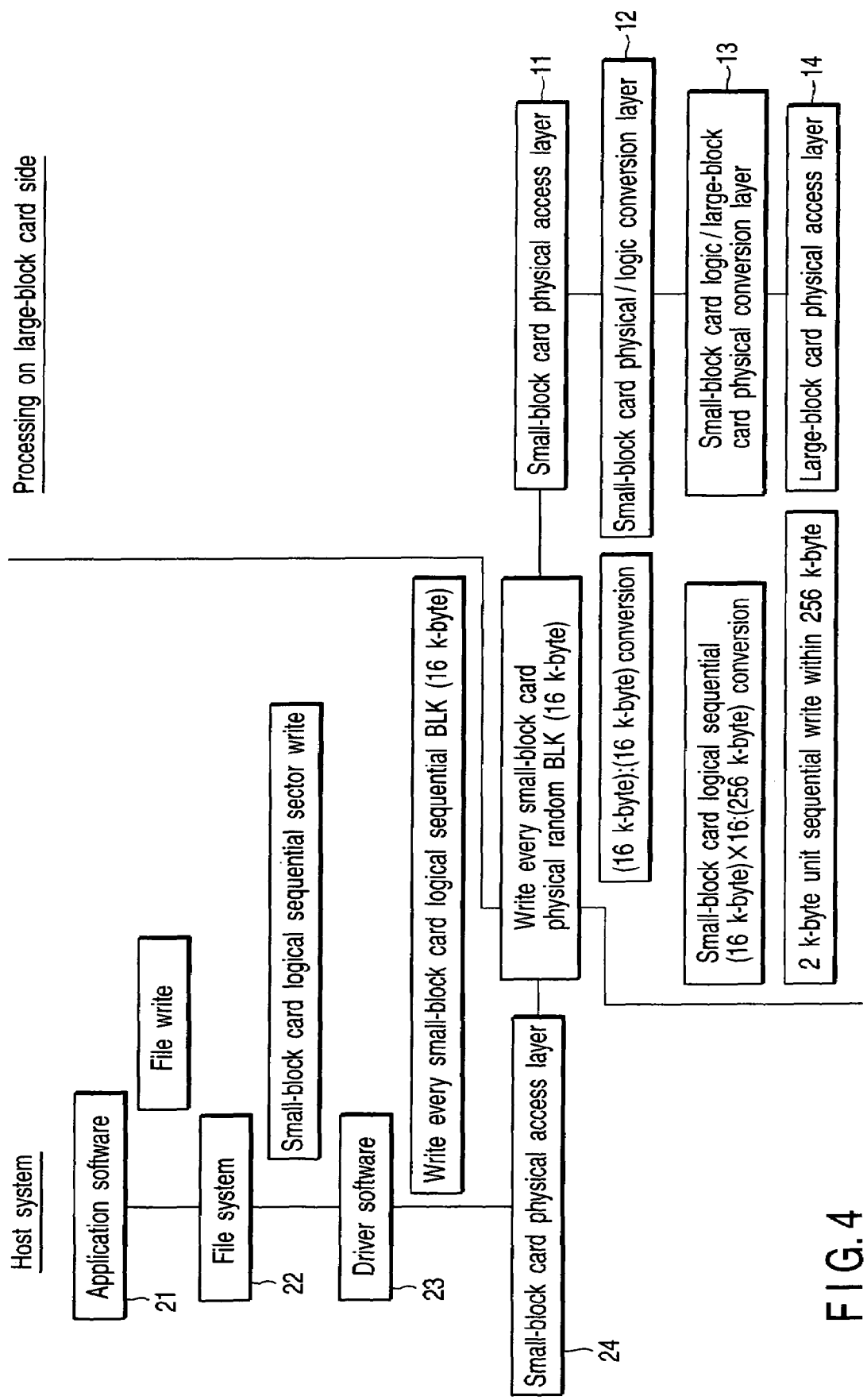
FIG. 4 is a view showing each communication hierarchy of a host apparatus and a memory card (large-block card)

FIG. 4 is a view showing each communication hierarchy of the system of the host side and the memory card 1 (large-block card).

The system of the host apparatus 20 has application software 21, file system 22, driver software 23 and small-block card physical access layer 24. On the other hand, the memory card 1 (large-block card) has small-block card physical access layer 11 and small-block card physical/logic conversion layer 12. Moreover, the memory card 1 further has small-block card logic/large-block card physical conversion layer 13 and large-block card physical access layer 14.

For example, if the application software 21 of the host apparatus 20 requests the file system 22 to make a file write, the file system 22 instructs the driver software 23 to make a sequential sector write based on a logic block address of the small-block card. On receiving the instruction, the driver software 23 makes a logic/physical block conversion when making sequential write for every 16 k-bytes based on the logic block address of the small-block card. Then, the driver software 23 issues a random write command based on the logic block address of the small-block card to the large-block card via the small-block card physical access layer 24, and transfers data.

In write access, the following assumption is made. More specifically, both small-block and large-block cards each make information exchange according to protocol in the following order.

(1) Command
(2) Page address (row address)
(3) Column address
(4) Data
(5) Program confirming command When receiving a write command based on a small-block card physical block address from the host apparatus 20, the small-block card physical access layer 11 on the large-block card side acquires the physical block address and data. In addition, the access layer 11 acquires a logic block address included in incidental data incidental to the foregoing data.

The small-block card physical/logic conversion layer 12 has a first table used in data read. The first table is used for making a conversion from a small-block card physical block address (corresponding to 16 k-byte block) to a small-block card logic block address (same as above). When the small-block card physical access-layer 11 receives the write command to acquire the small-block card logic block address, the conversion layer 12 reflects it in the first table.

The small-block card logic/large-block card physical conversion layer 13 has a second table used in data read. The second table is used for making a conversion from a small-block card logic block address (corresponding to sequential 16 k-byte block×16) to a large-block card physical block address (corresponding to a 256 k-byte physical block).

There is no need of recognizing whether the NAND flash memory is a multi-value or two-value type in use. Thus, the conversion layer 13 is not provided with respect to a memory cell, but provided with respect to the physical address. In other words, the conversion layer 13 has a table for converting a small-block logic address to a large-block logic address.

The conversion layer 12 reflects a logic block address of the small-block card to the second table when the small-block card physics access layer 11 acquires the logic block address of the small-block card in response to the write command.

The large-block card physical access layer 14 determines the internal data arrangement of the flash memory 3 based on the small-block card logic block address acquired by the small-block card physical access layer 11 receiving the write command. Then, the access layer 14 sequentially writes 16 k-byte data in 2 k-byte (one page) units within the 256 k-byte physical block. Moreover, the access layer 14 stores the acquired small-block card logic and physical block addresses in a predetermined area of the management data area of the flash memory 3.

As described above, the host apparatus 20 issues the command based on the small-block card physical block address. For this reason, the large-block card side performs processing in order to know which 256 k-byte physical block the data corresponding to the small-block card physical block address exists in. More specifically, the correspondence relationship between small-block card logic-physical block addresses is managed for every 16 k-byte block. Processing is carried out to know which 256 k-byte physical block of the large-block card the data corresponding to logic block address of continuous 256 k-byte block of the small-block card is stored.

FIG. 5 is a view showing a format of the command sent from the host apparatus 20.

The command sent from the host apparatus 20 has a packet shown in FIG. 5A. The packet includes various information, given below. More specifically, one type is command classification information ("write command" in FIG. 5A), and another is address information (physical block address). Another is data information (actual data such as contents and incidental data (512 bytes+16 bytes).

In the packet having the foregoing format, a small-block card "logic block address" (access target, that is, a logic address corresponding to a 16 k-byte block) is arranged in a predetermined position of 16-byte incidental data, as depicted in FIG. 5B. The large-block card acquires command classification information, address and data, and in addition, acquires the foregoing "logic block address" in particular. In this case, the "logic block address" is not added to a read command.

FIG. 6 is a view to compare the block write operation assumed by the host apparatus 20 with the write operation actually made by the memory card (large-block card).

When a sequential write operation of 16 k-byte block units based on the small-block card logic address occurs, the host apparatus 20 (left side in FIG. 6) performs the following operation. The host apparatus 20 makes a random write operation in 16 k-byte block units according to the small-block card physical block address.

On the other hand, the large-block card (right side in FIG. 6) sequentially writes 16 k-byte block unit data based on the small-block card logic block address to the flash memory 3.

As described above, the host apparatus 20 performs the random write operation of 16 k-byte block units according to the small-block card physical address. In the foregoing random write operation, it is general that the procedure for rewriting only part of the large block (256 k-byte) is frequently taken. In the NAND flash memory, erase at a block unit is only made; for this reason, if only part of the block is rewritten, the following procedure must be taken. More specifically, new rewrite data is written to an erased new block, and remaining non-rewritable data must be copied from the old block including old data rewritten to new data to a new block. Thus, the procedure for rewriting only part of the block requires the operation of copying non-rewritable data (hereinafter, referred to as "involved data copy"). For this reason, if the procedure for rewriting only part of the block is frequently performed, overheads are greatly increased. In view of the preceding circumstances, the large-block card again assigns the physical address according to the logic address sequence obtained from the host apparatus 20. By doing so, it is possible to simplify the procedure for rewriting only part of the block, and to prevent an increase in overheads.

FIG. 7 is a view showing a block format (equivalent to 256 k-byte physical blocks, which are an erase unit) of the NAND flash memory 3 included in the large-block card.

The large-block card includes 16 blocks for writing data corresponding to 16 k-bytes, which is a management unit of the host apparatus 20, in the erase unit, that is, 256 k-byte physical block. In data write, individual data are arranged in the order of the small-block card logic block addresses.

Each host management block is composed of 8 pages. Each page includes four 512-byte data areas and ECC areas corresponding to these data areas. Moreover, a 24-byte management data area is provided after the last 512-byte data area (i.e., the 4th 512-byte data area) of the page. Thus, the last 10-byte ECC area of the page has the configuration corresponding to both the 4th 512-byte data area and the 24-byte management data area.

In 128 24-byte management data areas included in the 256 k-byte physical block of the erase unit, the last 24-byte management data area is collectively stored with the following address informations. One is address information corresponding to the physical block address acquired from the command sent from the host apparatus 20. Another is address information corresponding to the logic block address acquired from the same as above. These address informations are used for preparing the first and second tables of the small-block card physical/logic conversion layer 12 and the small-block card logic/large-block card physical conversion layer 13.

Figure 8:
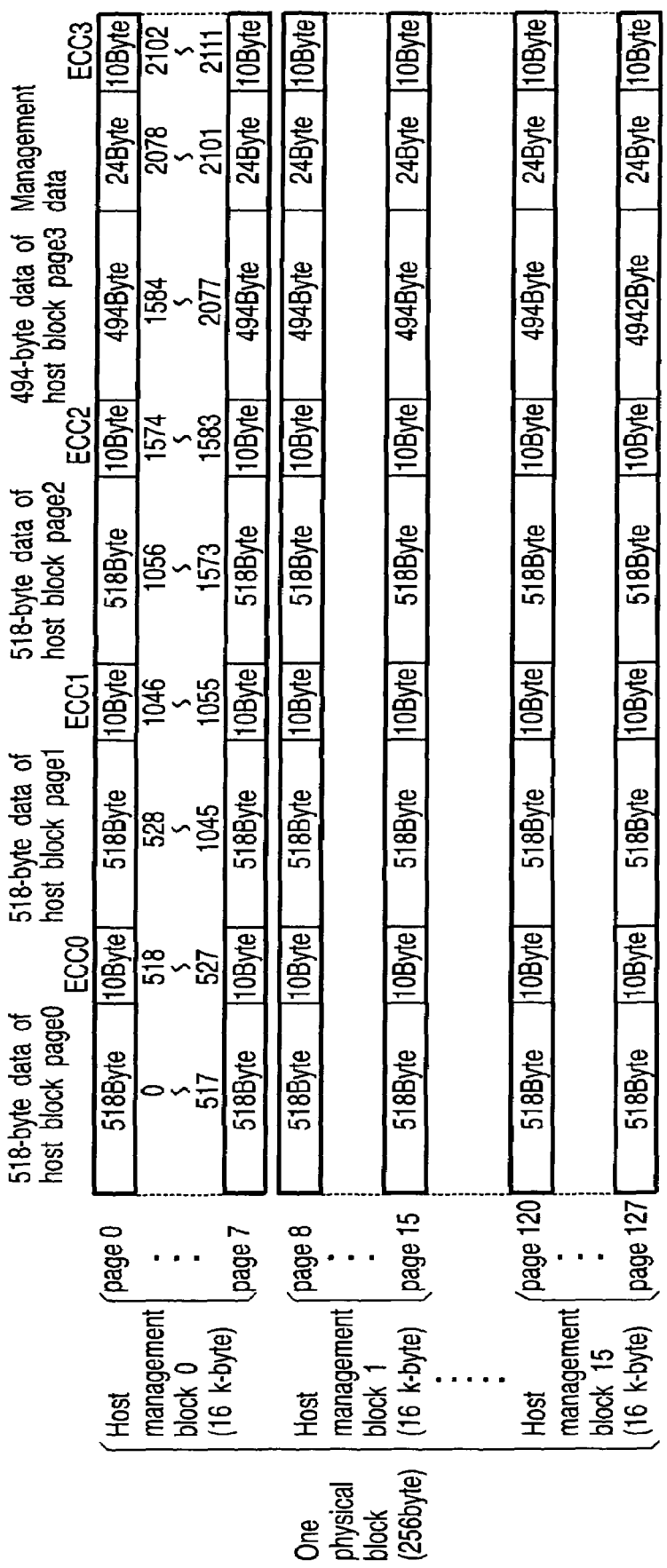
FIG. 8 is a view showing a block format different from FIG. 7.

FIG. 8 is a view showing a block format different from FIG. 7.

The block format shown in FIG. 8 differs from that shown in FIG. 7 in the arrangement of ECC0, ECC1 and ECC2 areas in each page. In this case, the storage capacity of user data in each page is the same in the block formats shown in FIG. 7 and FIG. 8. More specifically, in the block format shown in FIG. 7, each page is provided with a storage area of 2048 bytes (512 byte+512 byte+512 byte+512 byte). On the other hand, in the block format shown in FIG. 8, each page is provided with a storage area of 2048 bytes (518 byte+518 byte+518 byte+494 byte). The following is a description of the case where the block format shown in FIG. 8 is employed.

Figure 9:
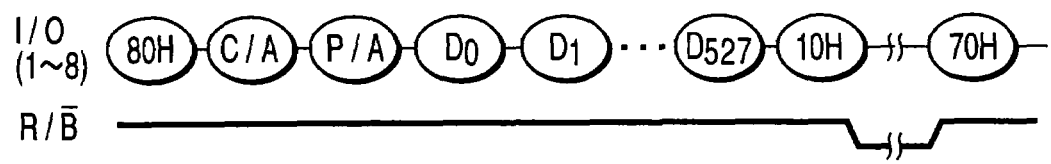
FIG. 9 is a timing chart showing a signal of I/O pin and R/B pin of a memory card of the embodiment when the host apparatus makes a write with respect to the memory card.

FIG. 9 is a timing chart showing each signal of the I/O pins and R/B pins of the memory card when the host apparatus 20 makes write to the memory card 1.

The host apparatus 20 controls the memory card on the assumption that the memory card is a non-volatile memory having a 16 k-byte erase block size. For example, when making write to the memory card, the host apparatus 20 inputs a serial data input command 80H (H shows hexadecimal number) to I/O pins 1 to 8. Then, the host apparatus 20 inputs column address C/A and page address P/A to these I/O pins 1 to 8. In this case, the foregoing column address C/A and page address P/A are a column address and page address in an actual physical space assumed by the host apparatus 20 with respect to the memory card 1.

The host apparatus 20 further inputs write data to each of the I/O pins 1 to 8 528 times. More specifically, the host apparatus 20 carries out input signal clocking to a write enable pin 528 times while successively shifting-in 528-bit data (528 bytes in total for all I/O pins) to each I/O pin. When data shift-in is completed, the host apparatus 20 inputs a program command 10H to the I/O pins 1 to 8. In response to the input, the memory card outputs a low level signal to the R/B pin to show that the memory card is in a busy state. Thereafter, the memory card outputs a high level signal to the R/B pin after a predetermined period, thereby showing that the memory card is in a ready state.

However, the R/B pin of FIG. 9 shows the state of the memory card 1 with respect to the host apparatus 20. In other words, the R/B pin shows the busy state (i.e., low level output) in response to the input of the program command 10H in FIG. 9. However, in this case, the write operation to the NAND flash memory 3 (i.e., data transfer from page buffer to memory cell array) is not necessarily made. Even if the R/B pin returns to the ready state, the write operation to the NAND flash memory 3 is not necessarily completed.

Figure 10:
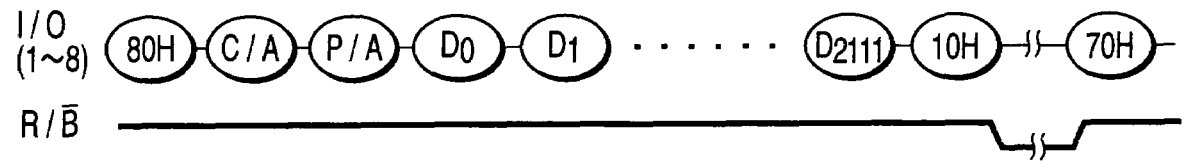
FIG. 10 is a timing chart showing a signal of I/O pin and R/B pin of a non-volatile memory included in a memory card of the embodiment when a controller included in the memory card makes a write with respect to the non-volatile memory of the memory card.

FIG. 10 is a timing chart showing each signal of I/O pins and R/B pins of the NAND flash memory 3 when the controller 4 of the memory card 1 makes write to the NAND flash memory 3 thereof.

The controller 4 recognizes that the NAND flash memory 3 is a non-volatile memory having a 256 k-byte erase block size. For example, when making write to the NAND flash memory 3, the controller 4 inputs a serial data input command 80H (H shows hexadecimal number) to I/O pins 1 to 8. Then, the controller 4 inputs column address C/A and page address P/A to these I/O pins 1 to 8. In this case, the foregoing column address C/A and page address P/A are column address and page address in an actual physical space assumed by the controller 4 with respect to the NAND flash memory 3. Therefore, these column address C/A and page address P/A do not necessarily coincide with those of FIG. 9.

The controller 4 further inputs write data to each of the I/O pins 1 to 8 2112 times. More specifically, the host apparatus 20 carries out input signal clocking to a write enable pin 2112 times while successively shifting-in 2112-bit data (2112 bytes in total for all I/O pins) to each I/O pin. When data shift-in is completed, the controller 4 inputs a program command 10H to the I/O pins 1 to 8. In response to the input, the memory card outputs a low level signal to the R/B pin to show that the memory card is in a busy state. Thereafter, the memory card outputs a high level signal to the R/B pin after a predetermined period, thereby showing that the memory card is in a ready state. The R/B pin of FIG. 10 shows the actual state of the NAND flash memory 3 with respect to the controller 4.

In FIG. 9 and FIG. 10, each input state of column address C/A and page address P/A is shown in one cycle. There is the case where the input state is properly shown by two cycles or more, depending on the capacity of the memory card 1 or the NAND flash memory 3.

As seen from FIG. 9 and FIG. 10, there is a limitation to the period when the memory card is in a busy state. For this reason, data write is made within the period, and information signifying that the memory card enters a ready state must be given to the host side after a predetermined period.

The multi-valued NAND flash memory 3 stores four-value data, and the same column of two pages commonly uses one memory cell. However, the user can make write without being conscious of the page of the large-block card.

Figure 11B:
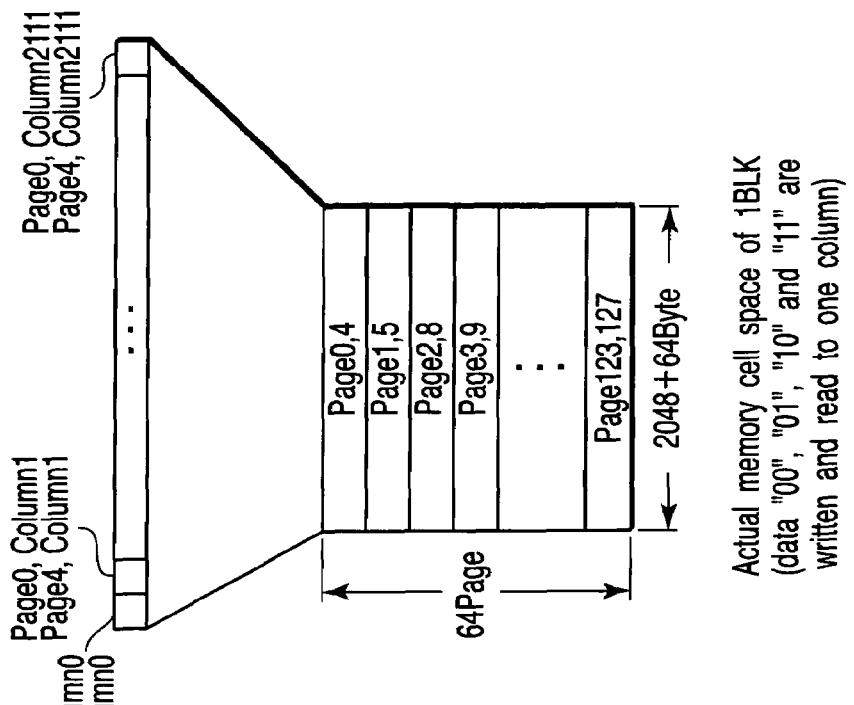
FIG. 11B is a view showing a real memory space of one block; and FIG. 12A to FIG. 12E is a block diagram to explain the operation of the embodiment.
Figure 11A:
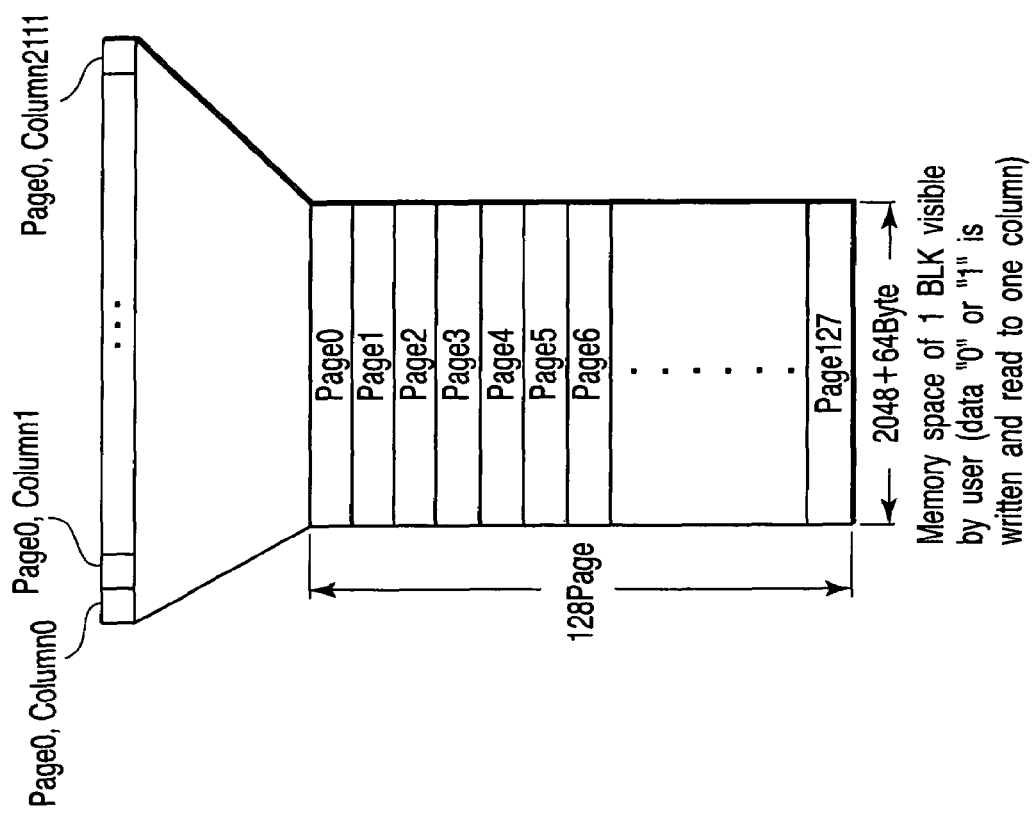
FIG. 11A is a view showing a memory space of one block viewed from the controller.

FIG. 11A shows a memory space of one block when viewing from the controller 4, and FIG. 11B shows a memory space of one block of the NAND flash memory 3.

As shown in FIG. 11A, the memory space of one block when viewing from the controller 4 is 128 pages×(2048+64 bytes), for example. Data stored in each column of each page is composed of page data only. More specifically, column0 of page0, column1 of page0 ...... column2111 of page0 are each stored with data of page0.

On the other hand, the memory space of one block of the NAND flash memory 3 is 64 pages×(2048+64 bytes) as shown in FIG. 11B. In other words, one page is stored with data equivalent to two pages. That is, data of a page0 and the page4 are stored in one page, for example. More specifically, column0 of page0 and column0 of page4, column1 of page0 and column1 of page4 ...... column2111 of page0 and column2111 of page4 are each stored in one page. In other words, one column is stored with two-bit data, that is, "00", "01", "10" and "11".

The reason why data is written to a memory cell in the foregoing manner is as follows. The scale-down of the memory cell advances, and thereby, capacitive coupling between memory cells adjacent to a word line remarkably occurs. In this case, if one of neighboring memory cells is programmed, there is a possibility that the threshold of the other thereof shifts. In order to prevent threshold variations coursed by the foregoing capacitive coupling, data is written to the lower page of the neighboring memory cell before data is written to the upper page in FIG. 11A. More specifically, data of page2 is written to the lower page of the neighboring memory cell before data is written to the upper page of the memory cell to which the data of page0 is written. Thereafter, data of page4 is written to the upper page of the memory cell. As described above, data is written to the lower page of the neighboring memory cell, and thereafter, written to the upper page, and thereby, it is possible to prevent the threshold variations. However, according to the page assignment described above, if data write to the upper page fails, data of the lower page written before four pages is lost. As a result, old data is lost as compared with the conventional page assignment. In order to solve the problem, the following control is carried out according to the embodiment.

(Operation of the Embodiment)

As described before, the multi-valued NAND flash memory 3 applied to the embodiment stores four-value data, and the same column of two pages commonly uses one memory cell. When writing data of page4 to a page to which data of page0 is written, there is a possibility that the data of page0 is destroyed. In this case, skip is made so that no data is written to page to which data of page0 is already written.

The skip condition is set in the following manner. For example, a user powers on a digital camera, and thereafter, takes some photographs in a short time. If write fails due to some reason, the photograph is retaken at once, and thereby, it is possible to leave the same photographs as above. Therefore, the influence by the write fail (error) is minimal. On the contrary, the user powers on the digital camera, and then, the write fails just after the user starts to take a photograph. In this case, there is a possibility that photograph data taken before power turns on is destroyed. In such a case, it is difficult to take the same photograph as above again. In order to solve the problem described above, in data write just after power turns on, a page commonly using the same memory cell as the page to which data is written before power is turned off is skipped to protect data written before power is turned off.

A FAT (File Allocation Table) is written, and thereafter, if data is written to the logic block address of the user area, data of the already written page must be protected. For this reason, in data write just after the FAT is written, a page commonly using the same memory cell as the page to which data is written before the FAT write is skipped to protect data before the FAT is written.

FIG. 1 and FIG. 12A to FIG. 12E are views to explain the operation of the memory card 1.

Figure 12A:
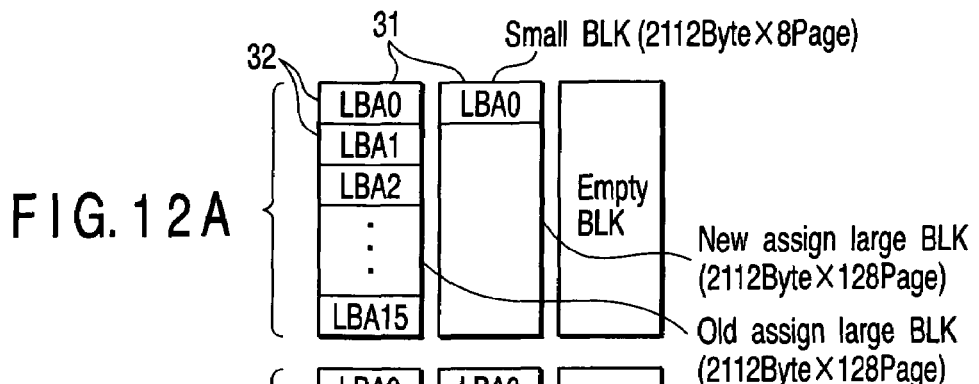

As shown in FIG. 12A, a large block BLK (31) has 16 small blocks (32). Logic block addresses LBA0 to LBA15 are respectively added to the small blocks. In this case, the large block BLK (31) is equivalent to the large-block card physical block; on the other hand, the small block (32) is equivalent to the host management block. One small block is set to 2112 bytes×8 pages; therefore, the small block is managed as an 8-page unit. The large block is set to 2112 bytes×128 pages; therefore, the large block is managed as a 128-page unit.

As described before, in many cases, the host apparatus 20 sequentially makes write access or read access with respect to the 16 k-byte logic address. The large-block card sequentially writes data of the small block (32) unit to the flash memory 3 according to the order of the logic block addresses. Thus, in the memory card, the small block in the generally assigned large block is successively selected, and data is written. In other words, if data is written to the logic block address LBA0, write waiting is given using the next written logic block address LBA1 as an expected value.

Figure 12B:
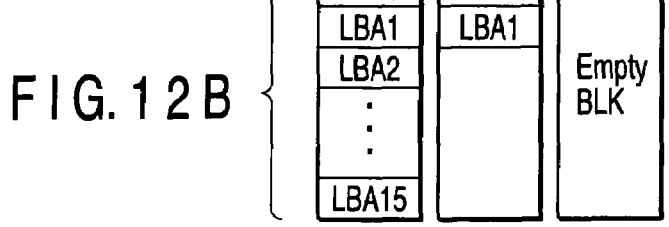

In this state, if data is written to the logic block address LBA1 as depicted in FIG. 12B, write waiting is given using the next written logic block address LBA2 as an expected value.

Figure 12C:
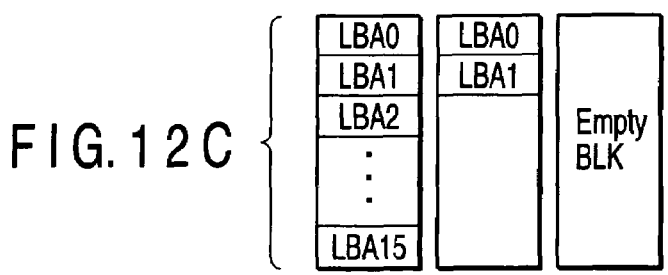

As described above, the following states after power turns on are given. One is the case where data is written to the logic block address LBA1 as shown in FIG. 12C. Another is the case where data is successively written to the logic block address as depicted in FIG. 12A and FIG. 12B. Another is the case where write waiting is given using the next written logic block address LBA2 as an expected value as shown in FIG. 12C. In this state, if write to another large block, for example FAT write is made, the expected value is skipped by one from the LBA2 to prevent the data of the logic block address LBA1 from being destroyed. For example, a write waiting state is given using logic block address LBA3 as an expected value.

The operation will be described below with reference to FIG. 1 and FIG. 12A to FIG. 12E.

When the power is turned on (S11), a new assign block in previous power break, old assign block and logic block address LBA (n) written lastly to the new assign block are read (S12). In this case, the new assign block is a large block to which logic block address is newly allocated in data rewrite and the old assign block is a large block stored with rewritten data. Thereafter, "2" is added to the logic block address LBA (n). In other words, an operation of n=n+2 is carried out (S13). By doing so, the expected value is skipped by one. More specifically, if the previous write state is the case shown in FIG. 12C, the expected value is LBA3, that is, write waiting is given in a state that the expected value is skipped by one (S14). In this state, it is determined whether or not the logic block address designated in the next write is LBA3.

Figure 12D:
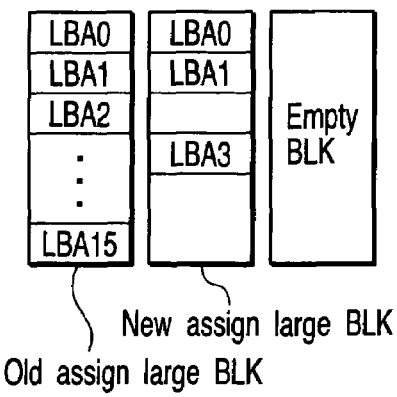
Figure 12E:
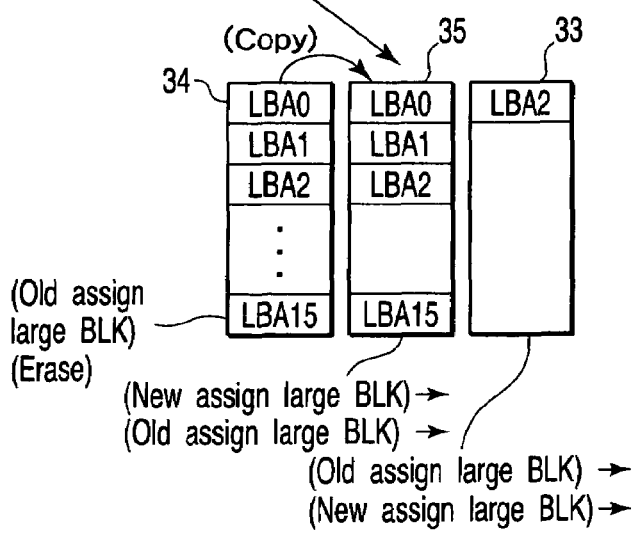

The determination is made; as a result, if the logic block address designated in the next write is LBA3, the control flow transfers to step (S15), and then, write to the logic block address LBA3 is made. Therefore, data is written to the logic block address LBA3 as illustrated in FIG. 12D. Thereafter, it is determined whether or not the large block (new assign block) is in a full state (S16). As a result, if data is not written to all logic block addresses of the large block, it is determined whether or not power is turned off (S17). If the power is not turned off, it is determined whether or not write to FAT is made (S18). If write to FAT is not made, the logic block address as an expected value is incremented (S19). In other words, an operation of n=n+1 is carried out; in this case, a write waiting state is given using logic block address LBA4 as an expected value (S14). Thereafter, if write to the logic block address LBA4 is made, the same operation as above is repeated.

On the other hand, after power turns on, or when the write to the FAT is made, if a logic block address different from the expected value is detected in step (S14), the control flow transfers to step (S21).

For example, in a state shown in FIG. 12C, if write waiting is given using the logic block address LBA3 as an expected value, write to the logic block address LBA2 is made. In this case, an empty large block is first detected (S21). As a result, data of the logic block address LBA2 is written to the detected large block 33 as seen from FIG. 12E (S22). In a spare time when write to the logic block address LBA2 is made, necessary data is copied from an old assign block 34 to a new assign block 35 (S22). Thereafter, data of the old assign block 34 is erased (S23). Then, the new assign block 35 is used as the old assign block, and the newly detected block 33 is used as a new assign block (S24). Thereafter, the control flow transfers to step S16.

In the step S16, if the new assign block is in a full state (has no empty area), the control flow transfers to step S25 to erase the old assign block. Then, the control flow transfers to step S17.

In the step S17, if power is turned off, the procedure ends.

In the step S18, if write to the FAT is detected, the control flow transfers to step S13. Then, "2" is added to the logic block address before write to the FAT is made, and the logic block address is skipped by one, and thereafter, a waiting state is given.

According to the foregoing embodiment, the following procedure is followed taken after power turns on or if data is written to the FAT. More specifically, skip is given without writing data to logic block address before power is turned off or an address continuous to the logic block address before data is written to the FAT. The next write waiting is given using another logic block address as an expected value. Thus, if the next write corresponds to the expected value, it is possible to prevent data destroy of the previously written page in the multi-valued NAND flash memory.

If the next write is made with respect to the logic block address different from the expected value, another large block is detected, and thereafter, write is made to the detected large block. Thus, even if the logic block address different from the expected value is given, it is possible to prevent data destroy of the previously written page in the multi-valued NAND flash memory.

The controller 4 of the memory card 1 controls the control operation shown in FIG. 1. However, the present invention is not limited to above; in this case, the controller of the host apparatus 20 may control the operation.

In the embodiment, the multi-valued NAND flash memory stores data of two pages in one memory cell. However, the present invention is not limited to the above, and even if data of three pages or more is stored in one memory cell, the foregoing embodiment is applicable.

In the embodiment, the multi-valued NAND flash memory is used as a non-volatile semiconductor memory device. However, the present invention is not limited to above; in this case, the embodiment is applicable to other non-volatile semiconductor memory devices so long as they store data of four values or more.

In the embodiment, the erase unit of the flash memory assumed by the host apparatus 20 is different from the actually used flash memory. However, the present invention is not limited to the above, and the embodiment is applicable even if the erase unit of the flash memory assumed by the host apparatus 20 is the same as the actually used flash memory.

In the embodiment, the logic block address of the small block is used as an expected value, and skip is given in small-block units. However, the present invention is not limited to the above. Skip may be given so long as data is not written to a page commonly using the same memory cell as the page to which data is already written. For example, in FIG. 11B, page2 and page8 commonly use the same memory cell. According to the foregoing page allocation, if data is written by page2, addresses equivalent to six pages are skipped, thereby preventing data from being written to page8 commonly using the same memory cell as page2.

The embodiment is applicable to SD™ (Secure Digital) cards and CF™ (compact Flash) cards.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of controlling a semiconductor memory device storing a multi-valued data having plural blocks, and capable of erasing data using the block as an erase unit, comprising:

skipping a block having an address following a block in which written data is stored in order to protect the written data when data is written after data writing is interrupted, and using an address of a block following the skipped block as an expected value;

determining whether or not a write address is an address corresponding to the expected value in data write; and storing write data in another block different from the block storing the written data when the write address is different from the address used as the expected value.

2. The method according to claim 1, wherein the block includes a plurality of memory cells, and each of the memory cells stores data of the same column of at least two pages in one memory cell.

3. The method according to claim 1, wherein the data is protected after power turns on.

4. The method according to claim 1, wherein the data is protected after data of FAT (File Allocation Table) is written.

5. A memory card according to claim 1, having a controller for executing the control method.

6. A host apparatus according to claim 1, having a controller for executing the control method.

7. A method of controlling a semiconductor memory device storing a multi-valued data, comprising:

detecting a first logic block address written in a first storage area before power is turned off when the power is turned on;

skipping a second logic block address next to the detected first logic block address in the first storage area, and giving a write waiting state using a third logic block address as an expected value;

detecting a second storage area used as an empty area when write by a fourth logic block address different from the expected value is made in the write waiting state;

writing data of the fourth logic block address to the detected second storage area;

copying data of the first logic block address written in the first storage area to the second storage area; and erasing data of the first logic block address written in the first storage area.

8. The method according to claim 7, wherein the first and second storage areas each have several memory cells, and each memory cell is commonly used by the same column of at least two pages.

9. A memory card according to claim 7, having a controller for executing the control method.

10. A host apparatus according to claim 7, having a controller for executing the control method.

11. A method of controlling a semiconductor memory device storing a multi-valued data, comprising:

detecting data write of FAT (File Allocation Table);

skipping a second logic block address next to a first logic block address of a logic block written to a first storage area before the FAT data is written when the FAT data write is detected;

waiting to write data using a third logic block address next to the second logic block address as an expected value;

detecting a second storage area used as an empty area when write by using a fourth logic block address different from the expected value is made in the waiting;

writing data of the fourth logic block address to the detected second storage area;

copying data of the first logic block address written in the first storage area to the second storage area; and erasing data of the first logic block address written in the first storage area.

12. The method according to claim 11, wherein the first and second storage areas each have a plurality of memory cells, and each memory cell is commonly used by the same column of at least two pages.

13. A memory card according to claim 11, having a controller for executing the control method.

14. A host apparatus according to claim 11, having a controller for executing the control method.

\* \* \* \* \*